(12) United States Patent
Suga

(10) Patent No.: US 12,124,637 B2
(45) Date of Patent: *Oct. 22, 2024

(54) IMAGE FORMING APPARATUS

(71) Applicant: CANON KABUSHIKI KAISHA, Tokyo (JP)

(72) Inventor: Daisuke Suga, Ibaraki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/501,057

(22) Filed: Nov. 3, 2023

(65) Prior Publication Data

US 2024/0069648 A1 Feb. 29, 2024

Related U.S. Application Data

(63) Continuation of application No. 17/374,760, filed on Jul. 13, 2021, now Pat. No. 11,841,992, which is a
(Continued)

(30) Foreign Application Priority Data

Feb. 5, 2019 (JP) .................................. 2019-018767

(51) Int. Cl.
*G06F 3/02* (2006.01)

(52) U.S. Cl.
CPC .................................. *G06F 3/0219* (2013.01)

(58) Field of Classification Search
CPC ......... G06F 3/02; G06F 3/0219; G03G 21/00; H04N 1/00; H04N 1/00384; H04N 1/0049; H04N 1/00408; B41J 29/00; H03M 11/18
See application file for complete search history.

(56) References Cited

U.S. PATENT DOCUMENTS 5,414,421 A 5/1995 Toshiba
6,532,499 B1 * 3/2003 Nakamura ............ G06F 3/0238
341/26
(Continued)

FOREIGN PATENT DOCUMENTS

JP 4-367924 A 12/1992
JP 2001-142612 A 5/2001
(Continued)

OTHER PUBLICATIONS

International Search Report issued Mar. 24, 2020 in corresponding PCT Application No. PCT/JP2020/005011. Cited During Prosecution of Parent U.S. Appl. No. 17/374,760.

*Primary Examiner* — Hang Lin
(74) *Attorney, Agent, or Firm* — VENABLE LLP

(57) ABSTRACT

An image forming apparatus controls a general-purpose numerical key unit so as to maintain a state in which a NumLock LED is turned on in the case where a connecting cable of the general-purpose numerical key unit including a NumLock key capable of selectively switching, in a case that the general-purpose numerical key unit is connected to an information processing device including a display screen, a condition when the information processing devices processes an inputted key signal, between a first processing condition in which the key signal is processed as information on a numerical value and a second processing condition in which the key signal is processed as information for moving a cursor displayed on the display screen, and the NumLock LED capable of notifying a user of that the first processing condition is set for the information processing device by being turned on is connected to a connecting portion.

6 Claims, 9 Drawing Sheets

Related U.S. Application Data continuation of application No. PCT/JP2020/005011, filed on Feb. 4, 2020.

(56) References Cited

U.S. PATENT DOCUMENTS

| | | | |
|---|---|---|---|
| 9,207,846 B2* | 12/2015 | Ichiyama | H04N 1/00307 |
| 2001/0030613 A1 | 10/2001 | Ideura | |
| 2008/0122795 A1* | 5/2008 | Sawada | G03G 15/5016 345/173 |

FOREIGN PATENT DOCUMENTS

| JP | 2006-338471 A | 12/2006 |
|---|---|---|
| JP | 2014-22927 A | 2/2014 |

\* cited by examiner

IMAGE FORMING APPARATUS

This application is a continuation of U.S. patent Application Ser. No. 17/374,760, filed Jul. 13, 2021, which is a continuation of International Patent Application No. PCT/JP2020/005011, filed Feb. 4, 2020, which claims the benefit of Japanese Patent Application No. 2019-018767, filed Feb. 5, 2019, the contents of each of which is incorporated by reference herein.

The present invention relates to an image forming apparatus to which an input device including a hardware key and to be externally connectable.

BACKGROUND ART

Conventionally, for example, an image forming apparatus of an electrophotographic type has been widely used as a copying machine, a printer, a facsimile (machine), a multifunction machine having a plurality of functions of these (machines), and the like. In such an image forming apparatus, in order to permit a user to perform input of numerical values such as the number of image formed sheets and a facsimile number or input of processing such as a start, a stop, or the like of image forming processing, for example, an operating portion (display portion) capable of displaying and inputting information on a front side upper portion of an apparatus main assembly is provided. As such an operating portion, for example, one provided with a touch panel where input keys (software keys) are displayed on a display screen and with hardware keys such as numerical keys, a start key, and a stop key has become widespread. The hardware keys are, for example, disposed adjacent to the touch panel.

In the image forming apparatus provided with an operating portion, when the number of sheets subjected to copying and a designation number (telephone number/FAX number) of facsimile are inputted, for example, a numerical key portion as software keys including numerical values from 0 to 9 is displayed on a touch panel. A user performs a touch operation at a numerical key portion of the touch panel, so that the user is capable of performing input of setting of the number of sheets subjected to copying and input of the designation number to the image forming apparatus. When a numeric displayed on the touch panel is touch-operated by the user, a controller acquires coordinate data, of a touched portion by the user, from the touch panel, and converts the coordinate data into numerical (value) information, and then executes a predetermined operation depending thereon.

However, when the input is carried out on the touch panel for receiving the numerical value input by the touch operation, the user cannot feel a physical sense of pushing-down. For this reason, the user performs an input operation while the user confirms the input one numeric by one numeric while looking at the display screen of the touch panel, so that improvement in operating property has been desired. In order to solve this, an image forming apparatus to which an input device (for example, a numerical key unit or a full-key board unit) including a numerical key portion comprised of physical hardware keys is externally connectable has been developed (Japanese Laid-Open Patent Application (JP-A) 2014-22927). To this image forming apparatus, the user externally connects the input device and pushes down a hardware key of the numerical key portion of the input device, whereby a predetermined key code is outputted, so that the user is capable of inputting the number of sheets subjected to copying, the designation number of the facsimile, and the like.

For example, the numerical key unit which is the input device is used for a Personal Computer (PC) of a note type in many instances. In this case, the user is capable of performing input of the numerical value by using the numerical key unit and an operation of moving a curser displayed on a screen of the PC. Further, through an operation of a NumLock key of the numerical key unit, it is possible to select a numerical (value) input mode by putting the NumLock (key) in an ON state and to select a curser movement mode by putting the NumLock (key) in an OFF state.

Further, in such a numerical key unit, for example, a NumLock LED (light source, light emitting portion) for displaying an ON/OFF state of the Numlock is provided so that the user is capable of recognizing the ON/OFF state of the NumLock. In this case, when the NumLock key is operated, a key code thereof is inputted to the PC, so that the PC switches an input mode thereof to the numerical input mode or the cursor movement mode. Together with this, the PC carries out communication to a controller of the numerical key unit so as to switch a turning-on (lighting) state of the NumLock LED by turning on the NumLock LED if the input mode is the numerical input mode and by turning off the NumLock LED if the input mode is the cursor movement mode, in response to operation of the state of the NumLock.

Problem to be Solved by the Invention

However, as in the image forming apparatus described in the above-described JP-A 2014-22927, in the case where an input device other than the input device dedicated to the image forming apparatus, a so-called general-purpose input device is externally connected, various problems occurred in some cases.

It is an object of the present invention is to provide an image forming apparatus capable of solving the various problems in the case where the general-purpose input device is connected to the image forming apparatus.

Means for Solving the Problem

The image forming apparatus of the present invention is an image forming apparatus to which an input device including a plurality of hardware keys which include a numerical key portion where a plurality of numerical keys capable of inputting numerical information on 0 to 9, respectively, by being pushed down by a user are provided in an arrangement of an electronic calculator type, an outputting portion for outputting a key signal corresponding to each of the hardware keys, a switching key capable of selectively switching, in a case that the input device is connected to an information processing device including a display screen, a condition when the information processing device processes the key signal from the outputting portion, between a first processing condition in which the key signal is processed as information on a numerical value and a second processing condition in which the key signal is processed as information for moving a cursor displayed on the display screen, and a light emitting portion capable of notifying a user of that the first processing condition is set for the information processing device by being turned on and capable of notifying the user of that the second processing condition is set for the information processing device by being turned off is connectable, the image forming apparatus comprising: an image reading device for reading an image of an original; an image forming portion for forming the image on a recording medium on the basis of a reading result of the image reading device; an operating panel capable of displaying a software execution key, as a software key, for providing an instruction of a start of image reading to the image reading device; a connecting portion capable of connecting the input device; and a controller for controlling the input device so as to maintain a state in which the light emitting portion is turned on.

Further, the image forming apparatus of the present invention is an image forming apparatus to which an input device including a plurality of hardware keys which include a numerical key portion where a plurality of numerical keys capable of inputting numerical information on 0 to 9, respectively, by being pushed down by a user are provided in an arrangement of an electronic calculator type, an outputting portion for outputting a key signal corresponding to each of the hardware keys, a switching key capable of selectively switching, in a case that the input device is connected to an information processing device including a display screen, a condition when the information processing device processes the key signal from the outputting portion, between a first processing condition in which the key signal is processed as information on a numerical value and a second processing condition in which the key signal is processed as information for moving a cursor displayed on the display screen, and a light emitting portion capable of notifying a user of that the first processing condition is set for the information processing device by being turned on and capable of notifying the user of that the second processing condition is set for the information processing device by being turned off is connectable, the image forming apparatus comprising: an image reading device for reading an image of an original; an image forming portion for forming the image on a recording medium on the basis of a reading result of the image reading device; an operating panel capable of displaying a software execution key, as a software key, for providing an instruction of a start of image reading to the image reading device; a connecting portion capable of connecting the input device; and a controller for controlling the input device so as to turned on the light emitting portion in response to connection of the input device to the connecting portion.

Further, the image forming apparatus of the present invention is an image forming apparatus to which an input device including a plurality of hardware keys which include a numerical key portion where a plurality of numerical keys capable of inputting numerical information on 0 to 9, respectively, by being pushed down by a user are provided in an arrangement of an electronic calculator type, an outputting portion for outputting a key signal corresponding to each of the hardware keys, a switching key capable of selectively switching, in a case that the input device is connected to an information processing device including a display screen, a condition when the information processing device processes the key signal from the outputting portion, between a first processing condition in which the key signal is processed as information on a numerical value and a second processing condition in which the key signal is processed as information for moving a cursor displayed on the display screen, and a light emitting portion capable of notifying a user of that the first processing condition is set for the information processing device by being turned on and capable of notifying the user of that the second processing condition is set for the information processing device by being turned off is connectable, the image forming apparatus comprising: an image reading device for reading an image of an original; an image forming portion for forming the image on a recording medium on the basis of a reading result of the image reading device; an operating panel capable of displaying a software execution key, as a software key, for providing an instruction of a start of image reading to the image reading device; a connecting portion capable of connecting the input device; and a receiving portion for receiving the key signal; a processing portion for processing the key signal received by the receiving portion on the basis of a processing condition; and a setting portion where irrespective of the notification light emitting portion is turned on, a condition for processing, as information a numerical value, the key signal received by the receiving portion is set to the processing portion as the processing condition.

Effect of the Invention

According to the present invention, it is possible to solve the various problems in the case where the general-purpose input device is connected to the image forming apparatus.

EMBODIMENTS FOR CARRYING OUT THE INVENTION

First Embodiment

In the following, a first embodiment of the present invention will be specifically described with reference to FIGS. 1 to 8. Incidentally, in this embodiment, as shown in each of the figures, toward an image forming apparatus 1, a front side is represented by a front side F, a rear side (rear) is represented by a back side B, a left(-hand) side is represented by L, a right(-hand) side is represented by R, an upper (upward) side is represented by U, and a lower (downward) side is represented by D. Further, the image forming apparatus 1 is constituted so that a user is positioned from the front side F toward the back side B and performs various operations.

In this embodiment, as an example of the image forming apparatus 1, a full-color printer of a tandem type is described. However, the present invention is not limited to one mounted on the image forming apparatus 1 of the tandem type but may also be one mounted on an image forming apparatus of another type, and further, the present invention is not limited to one for a full-color image, but may also be one for a monochromatic image or for a mono-color (single color) image. Or, the present invention can be carried out in various uses, such as printers, various printing machines, copying machines, facsimile machines and multi-function machines.

<Image Forming Apparatus>

Figure 1:
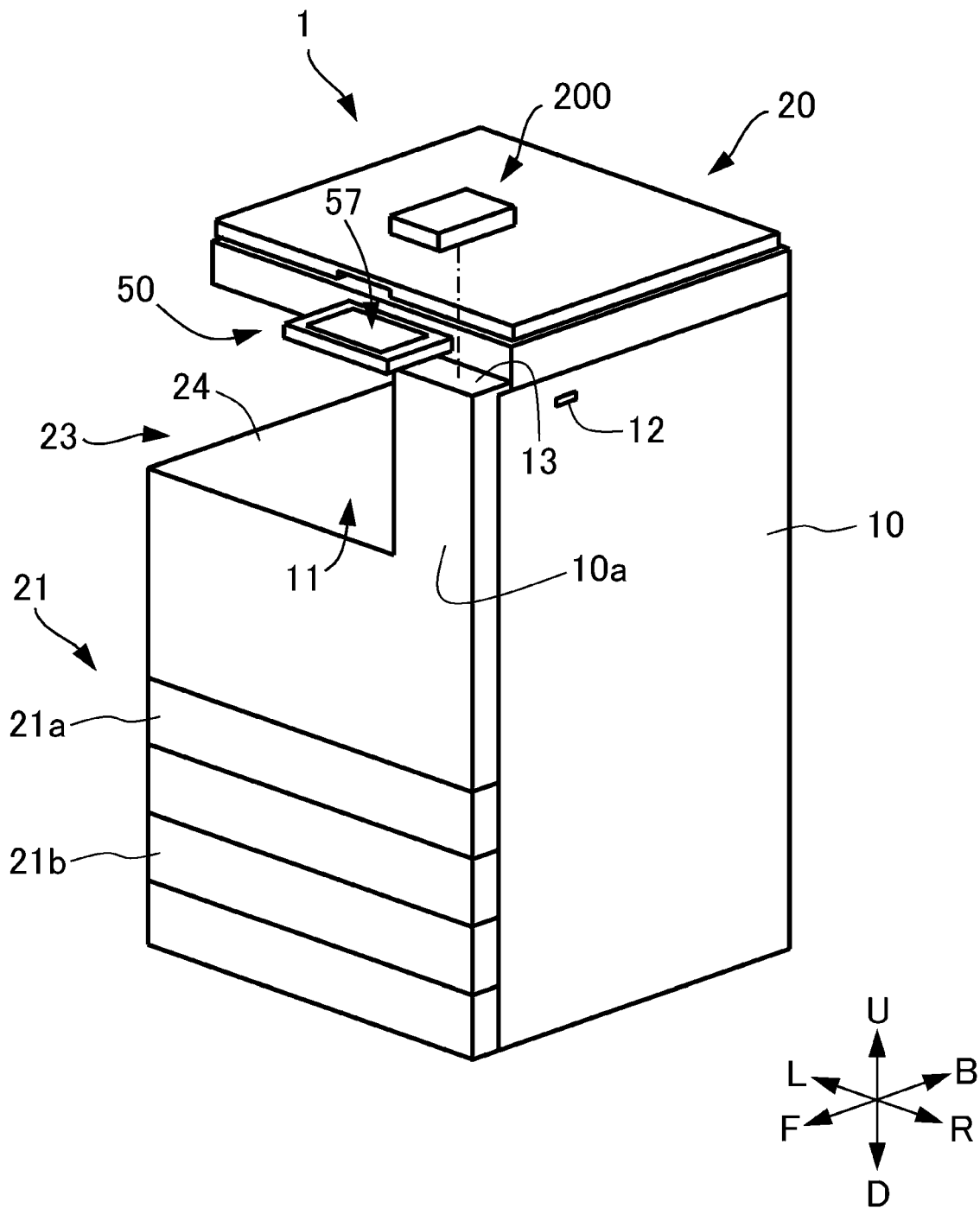
FIG. 1 is a perspective view showing a schematic structure of an image forming apparatus according to a first embodiment.

As shown in FIG. 1, the image forming apparatus of this embodiment includes an image forming apparatus main assembly (hereinafter, referred to as an apparatus main assembly) 10. The apparatus main assembly 10 includes an image reading portion 20, a sheet feeding portion 21, an image forming portion 22 (see FIG. 2), a sheet discharging portion 23, a controller 30 (see FIG. 2) and an operating portion 50. Incidentally, on the sheet as a recording material, a toner image is to be formed, and specific examples of the sheet may include plain paper, a resin-made material sheet as a substitute for the plain paper, thick paper, a sheet for an overhead projector, and the like.

The image reading portion 20 is, for example, a flat head scanner device, and is provided at an upper portion of the apparatus main assembly 10 with respect to a vertical direction. The image reading portion 20 includes an unshown platen glass as an original mounting table, an unshown light source for irradiating an original, placed on the platen glass, with light, and an unshown image sensor for converting reflected light into a digital signal, and the like member. The sheet feeding portion 21 is disposed at a lower portion of the apparatus main assembly 10, and includes sheet cassettes 21a and 21b for stacking and accommodating the sheet such as recording paper, and feeds the sheet to the image forming portion 22 (see FIG. 2).

The image forming portion 22 is provided inside the apparatus main assembly 10 and includes image forming units each including an unshown developing device and an unshown photosensitive drum as an image bearing member, toner bottles, an intermediary transfer unit, a secondary transfer portion, a fixing device, and the like. The image forming portion 22 is capable of forming an image onto the sheet fed from the sheet feeding portion 21, on the basis of image information from a controller 30. The sheet discharging portion 23 includes a discharging tray 24 provided on a side downstream of an unshown discharge opening formed in the apparatus main assembly 10. The discharging tray 24 is a face-down tray, and the sheet discharged through the discharge opening is stacked on the discharge tray 24. Further, a space between the image reading portion 20 and the discharge tray 24 constitutes an in-body space portion 11.

<Controller>

Figure 2:
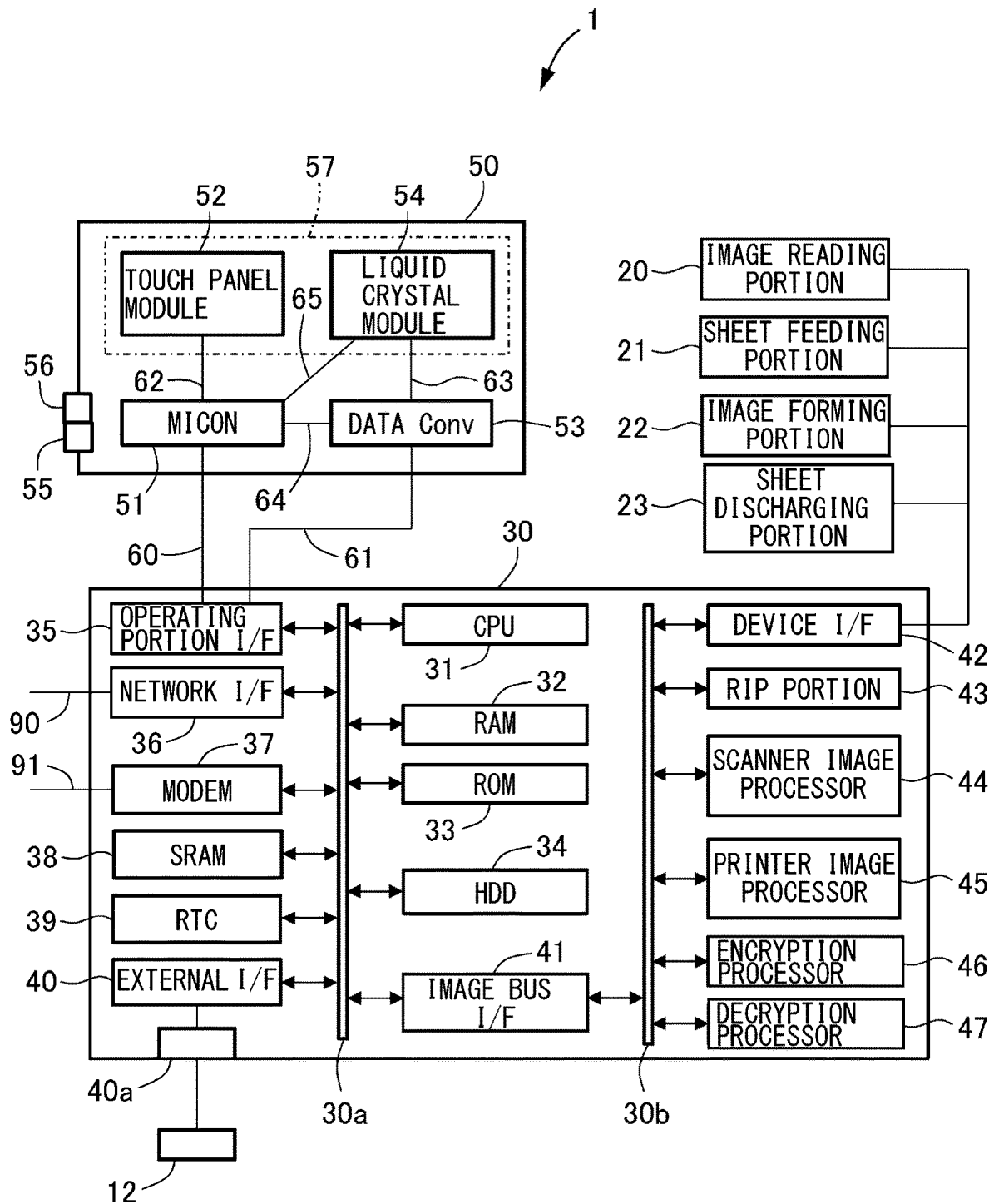
FIG. 2 is a control black diagram of the image forming apparatus according to the first embodiment.

As shown in FIG. 2, the controller 30 is constituted by a computer, and for example, includes a CPU 31, a RAM 32 for temporarily storing data, a ROM 33 for storing a program for controlling respective portions, and an HDD 34. In this embodiment, the controller 30 includes a system bus 30a and an image bus 30b, and each of the CPU 31, the RAM 32, the ROM 33, and the HDD 34 is connected to the system bus 30a. The CPU 31 is a processor for carrying out integrated control of a entirety of the image forming apparatus 1 and is a main body of a system controller. The CPU 31 carries out, for example, image processing of image data for image formation and carries out network control, and in addition, controls image forming processing by not only outputting an instruction of image formation to the image forming portion 22 but also transmitting and receiving information between itself and the operating portion 50.

The RAM 32 is a system work memory for operating the CPU 31 and is also an image memory for temporarily storing the image data, and functions as a main memory, a work area, and the like of the CPU 31. In the RAM 32, setting information in the image forming apparatus 1, and a job log and an operation log when respective processes are performed are stored. In the ROM 33, an image formation control sequence or the like for forming an image on a sheet is stored. In this embodiment, the ROM 33 is, for example, a boot ROM and stores a boot program of a system. The HDD 34 is a hard disk drive and stores a system software, an application, the image data, and the like.

The controller 30 includes an operating portion input/output circuit (UF) 35, a network input/output circuit (UF) 36, a modem 37, an SRAM 38, an RTC 39, and an external input/output circuit (UF) 40, which are each connected to the system bus 30b. The operating portion input/output circuit (UF) 35 not only carries out transmission of the image data to an operating portion 50 described later and various communications from the operating portion 50 but also inputs, to the CPU 31, information inputted from the operating portion 50 by a user.

The network input/output circuit 36 is connected to a network 90 and carries out input/output of the information. Further, the modem 37 is connected to a public line (network) 91 and functions as a facsimile communication portion capable of transmitting and receiving data via a telephone line, and carries out input/output of the information. By this, the controller 30 is capable of communicating with another PC and server, connected thereto, via the network 90 by the network input/output circuit 36 or via the public line 91 by the modem 37 under instruction of the CPU 31. That is, the image forming apparatus 1 is connected to the network 90 or the public line 91, and carries out input/output of image information and device information.

The SRAM 38 is a nonvolatile storing medium capable of high-speed operation. The RTC 39 is a real time clock, and performs processing in which a current time is continuously counted even in a state in which power is not supplied to the controller 30. The external input/output circuit 40 is a general-purpose input/output circuit such as USB and connects a general-purpose PC, a memory device, and a general-purpose numerical key unit 200 or a dedicated numerical key unit 70 which is described later via a USB connector 40a of a USB standard and a USB port (first connecting portion) 12. Incidentally, the USB is an abbreviation of a Universal Serial Bus. The USB port 12 is, for example, a connector installed on a side surface or a front surface of an installation surface 13 (see FIG. 1), described later, where the general-purpose numerical key unit 200 or the dedicated numerical key unit 70 is installed, or on a side surface of the operating portion 50. To the USB port 12, the general-purpose numerical key unit 200 or the dedicated numerical key unit 70 is connectable.

The controller 30 includes an image bus input/output circuit (UF) 41. The image bus input/output (UF) 41 is a bus bridge which connects the system bus 30a and the image bus 30b transferring the image data at high speed and which converts a data structure. The image bus 30b is constituted by, for example, a PCI bus or an IEEE 1394.

The controller 30 includes a device input/output circuit (I/F) 42, a RIP portion 43, a scanner image processing portion 44, an printer image processing portion 45, an encryption processing portion 46, and a decryption processing portion 47, which are each connected to the image bus 30b. The device input/output circuit 42 connects the image reading portion 20 and the image forming portion 22 to the controller 30 and performs a synchronous line and a non-synchronous line of the image data. The RIP portion 43 is a raster image processor and develops PDL data into a bit-mapped image. The scanner image processing portion 44 performs correction, processing and editing of the image data. The printer image processing portion 45 subjects print output image data to printer correction, resolution conversion, and the like. The encryption processing portion 46 subjects input data including the image data to encryption processing. The description processing portion 47 subjects encrypted data to description processing.

<Operating Portion>

Next, an example of a hardware constitution for controlling respective pieces of software of the operating portion (display portion) 50 will be described. The operating portion 50 includes a micon 51, a touch panel module 52, a data converter (Cony) 53, and a liquid crystal module 54. The operating portion 50 is connected to the controller 30 by a serial bus 60 for establishing communication with the CPU 31 and by a bus 61 for transferring data for being displayed on the liquid crystal module 54.

The micon 51 is a microcomputer for carrying out integrated control of entirety of the operating portion 50. Inside the micon 51, a ROM in which a program for operating the micon 51 is stored is mounted. The touch panel module 52 is disposed on a surface of the liquid crystal module 54, and by user's touch, the touch panel module 52 notifies the micon 51 of positional information of a touched portion via a touch panel communication bus 62. The operating portion 50 is capable of causing the liquid crystal module 54 to display software keys and the user is capable of inputting information by contact with the touch panel module 52. The touch panel module 52 is constituted by a touch panel device and a touch panel device controller. As a touch panel device, those of any types such as a resistive film type, an electrostatic capacity type, and an optical type of infrared radiation or the like may also be applied.

The data converter 53 is a module which receives the image data from the operating portion IN/output circuit 35 of the controller 30 via the bus 61 and which then converts the image data into data format which is capable of being received by the liquid crystal module 54. For example, from the controller 30, the data converter 53 receives data of standards such as Display Port and HDMI (registered trademark) and converts the data into LVDS and signal format of a CMOS level which are capable of being received by the liquid crystal module 54, and then inputs the converted data to the liquid crystal module 54 via a bus 63. Further, the data converter 53 is connected to the micon 51 by a bus 64, and also has a function of overwriting the image data sent from the controller 30 with the image data generated by the micon 51 at a predetermined position.

The liquid crystal module 54 is a module constituted by an LCD and a backlight module, and receives data from the data converter 53 via the bus 63 and then transfers the image data to the LCD at a timing determined in advance. At this time, by causing the backlight module to emit light, the image data transferred to the LCD is displayed as a visible image. Adjustment of brightness of the back light is performed by operating switches 55 and 56 dedicated for brightness adjustment accompanying the operating portion 50.

As shown in FIG. 1, the operating portion 50 is provided on a front side F than a central portion of the image forming apparatus 1 with respect to a front-rear direction and is provided at an upper portion of a front cover 10a which is a part of an outer casing cover of the apparatus main assembly 10. The operating portion 50 is formed in, for example, a rectangular flat plate shape, and is fixedly provided to the apparatus main assembly 10 with a panel surface 57, toward an upper side U, constituted by laminating the touch panel module 52 on the liquid crystal module 54 (see FIG. 2). The software keys displayed on the panel surface 57 are input keys for detecting input of keys to touch operation of each of display portions. Incidentally, the shape of the operating portion 50 is not limited to the rectangular flat plate shape, but may also be another shape. Further, a direction of the touch panel module 52 and the liquid crystal module 54 is not limited to the upper side U, but may also be another direction, and for example, these modules may also be provided so as to be tiltable in an up-down direction relative to the apparatus main assembly 10 and so that the direction of the touch panel module 52 and the liquid crystal module 54 is changeable. On the right side R of the operating portion 50, the installation surface 13 facing toward the upper side U on the right side of the front side F of the apparatus main assembly 10 adjacent to the operating portion 50 is provided. On the installation surface 13, the general-purpose numerical key unit 200 or the dedicated numerical key unit 70 or the like is capable of being installed, and by installation, the general-purpose numerical key unit 200 or the dedicated numerical key unit 70 is disposed adjacent to the right side R of the operating portion 50 as viewed from the front side. In an outer casing of the apparatus main assembly 10, the USB port 12 is provided on the side surface of the right surface R of the installation surface 13. The user is capable of carrying out USB connection to the USB port 12 by mounting external equipment having a USB terminal, such as the general-purpose numerical key unit 200 or the dedicated numerical key unit 70, an IC card reader, a USB memory, and the like.

<General-Purpose Numerical Key (Ten Key) Unit>

Figure 3:
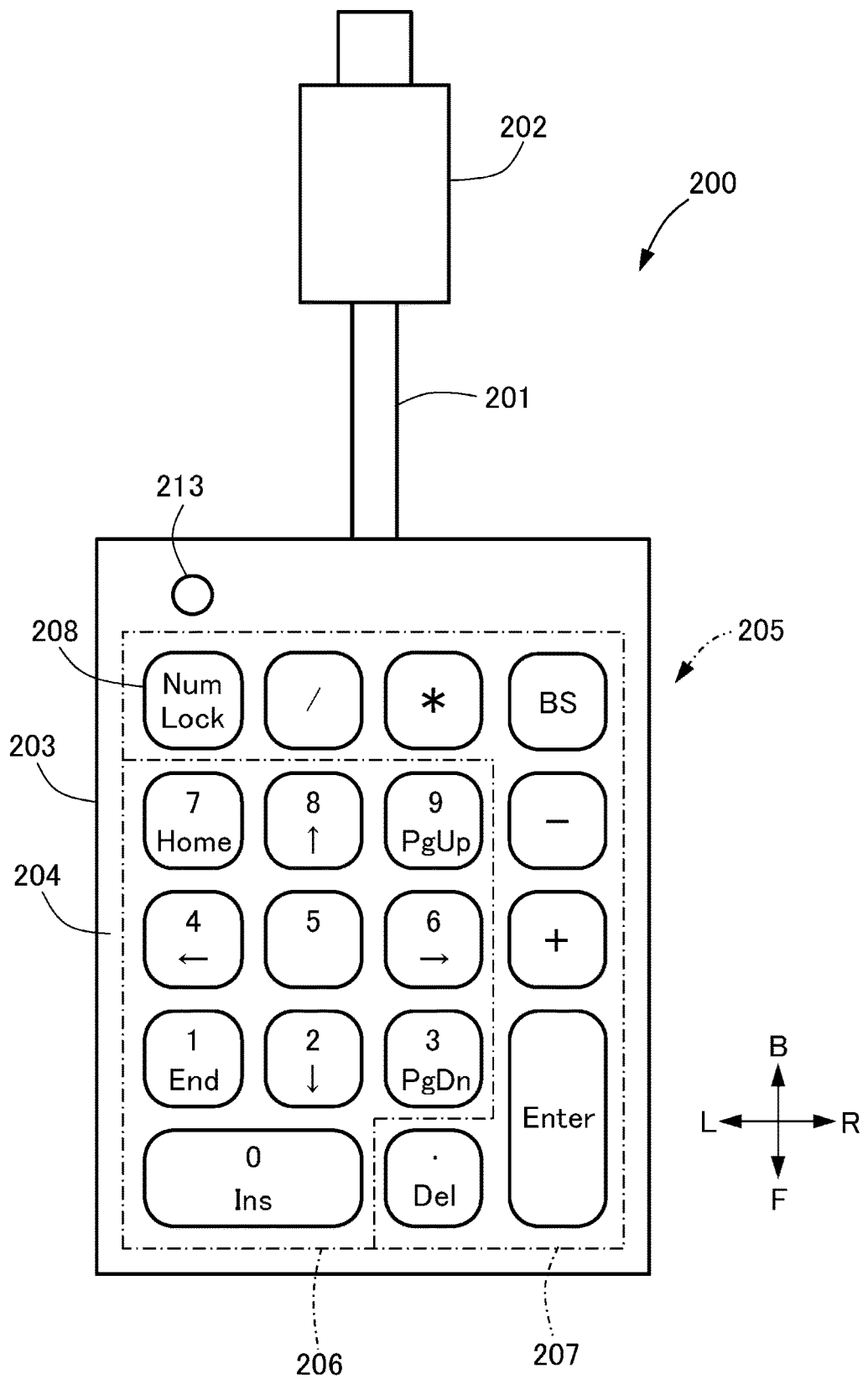
FIG. 3 is a top plan view of a general-purpose numerical key unit connectable to the image forming apparatus according to the first embodiment.

Next, a hardware constitution and an operation of the general-purpose numerical key unit 200 which is the input device connected to the image forming apparatus 1 will be described. As shown in FIG. 3, the general-purpose numerical key unit 200 includes a connecting cable (second connecting portion) 201 comprised of a USB cable and a USB connector 202, and is connectable to a general PC, and in addition, to the image forming apparatus 1 of this embodiment. Incidentally, in this embodiment, the general-purpose numerical key unit 200 cable-connected by the connecting cable 201 will be described, but the present invention may also be applied to a general-purpose numerical key unit wirelessly connected to the controller 30.

The general-purpose numerical key unit 200 not only includes a plurality of operation keys (hardware keys) 205, but also in the case where the general-purpose numerical key unit 200 is mounted to the image forming apparatus 1 including the operating portion 50 capable of inputting information, the general-purpose numerical key unit 200 is capable of inputting information to the image forming apparatus 1 separately from the operating portion 50. As an example of different uses for different purposes in information input between the operating portion 50 and the general-purpose numerical key unit 200, setting of a density, a size, and the like relating to image formation is inputted from the operating portion 50, and numerical values such as the number of sheets subjected to the image formation and a designation number of a facsimile are inputted from the general-purpose numerical key unit 200. Incidentally, in the present specification, the numerical key is a concept including either of the case where the numerical key shows 10 numerical keys from 0 to 9, the case where the numerical key shows 12 keys in which "*" and "#" are added to the (10) numerical keys, and the case where the numerical key shows about 20 keys in which numerical keys include four arithmetic operators, a "NumLock", and the like.

The general-purpose numerical key unit 200 includes, for example, a casing 203, an upper cover 204 provided on an upper surface of the casing 203, and operation keys 205 provided on the upper cover 204. The operation keys 205 roughly include a numerical key portion (numerical value key portion) 206 and a functional key portion 207. The numerical key portion 206 includes at least numerical keys of "0" to "9" by being pushed down and can be utilized in the case where numerical (value) input is needed, such as designation of the number of sheets subjected to printing during the printing, setting of a margin length, and the like. The functional key portion 207 includes a NumLock key (switching key) 208 and keys of "I", "*", "BS", "−", "+", "Enter", and ".". That is, the function key portion 207 has a function of a four arithmetic operator key portion capable of inputting information on four arithmetic operators. The NumLock key 208 is capable of selectively switching an input mode, described later, of the numerical key portion 206.

Here, the general-purpose numerical key unit 200 of this embodiment is designed for the purpose of being principally connected to a desktop PC, a note PC, or the like. That is, uses of the general-purpose numerical key unit 200 are principally electronic calculator input and numerical value input, and the general-purpose numerical key unit 200 is not designed for the purpose of inputting a facsimile designation number by being connected to the image forming apparatus 1. For that reason, as shown in FIG. 3, a key arrangement of the general-purpose numerical key unit 200 is similar to a key arrangement of the electronic calculator. That is, the key arrangement of the general-purpose numerical key unit 200 is similar to a key arrangement defined in an ISO (International Standards Organization). That is, as shown in FIG. 3, in the numerical key portion 206, numerical keys from 0 to 9 are adjacently disposed so that 7 to 9 are on a backmost side B, 4 to 6 are on a front side F thereof, and 1 to 3 are on a front side F thereof. For this reason, the numerical key portion 206 is comprised of hardware keys which are arranged so that the numerical key of 1 is on the front side F (front side) than the numerical key of 9 as viewed from the front (surface) side of the apparatus main assembly 10 in a state in which the casing 203 is mounted on the apparatus main assembly. Further, on the front side F of the numerical keys of 1 and 2, the numerical key of 0 is disposed.

In other words, with respect to the 10 hardware keys from 0 to 9, a row of the numerical keys of 7, 8 and 9 is disposed on the rearmost side, and a row of the numerical keys of 4, 5 and 6 is disposed on a side in front of the row of 7, 8 and 9. Further, a row of the numerical keys of 1, 2 and 3 is disposed on a side in front of the row of the numerical keys 4, 5 and 6. Further, the hardware key of 0 is disposed on a side in front of the row of the hardware keys of 1, 2 and 3. Further, when these numerical keys from 0 to 9 are viewed in column, from a left(-hand) side, these numerical keys are arranged in the order of a column of the numerical keys 1, 4 and 7, a column of the hardware keys 2, 5 and 8, and a column of the numerical keys 3, 6 and 9. That is, the numerical keys of 1 to 9 are aligned and arranged in a matrix of 3×3 in the case where the numerical key unit 70 is viewed from the front side, so that from an upper stage in a column direction, the numerical keys of 7 to 9, the numerical keys of 4 to 6, and the numerical keys of 1 to 3 are sequentially disposed and so that the numerical key of 0 is disposed on a further lower stage than the row of the numerical keys of 1 to 3. Here, FIG. 3 is a view in which the general-purpose numerical key unit 200 is viewed from the front side and is the view in which the general-purpose numerical key unit 200 is viewed from a direction parallel to a pushing-down direction of each of the numerical keys. Incidentally, the front side view in this embodiment is a position where as shown in FIG. 3, numerical values and characters, and the like provided on the hardware keys are properly seen in an up-down direction. The hardware key of 0 is disposed so as to bridge over the column of the hardware keys of 1, 4 and 7 and the column of the hardware keys of 2, 5 and 8. Further, the general-purpose numerical key unit 200 may also be one provided with a numerical key of 00 in addition to the numerical key of 0. Further, the numerical key of 0 may also be disposed so as to be included in the column of the hardware keys of 2, 5 and 8 or the column of the hardware keys 3, 6 and 9. Further, on the right side R and the back side B of the numerical key portion 206, the functional key portion 207 is disposed. Thus, the general-purpose numerical key unit 200 is not designed for the purpose of inputting the facsimile designation number, and therefore, is different in key arrangement from the dedicated numerical key unit 70 described later.

As regards the general-purpose numerical key unit 200, as shown in FIG. 1, the casing 203 is adjacent to the right side R of the operating portion 50 of the image forming apparatus 1 and is mounted, for example, by screwing or bonding, on the installation surface 13 facing the upper side U on a right side R of the front side R of the apparatus main assembly 10. By this, the user can easily use the general-purpose numerical key unit 200 by utilizing a right hand while looking at the operating portion 50.

Figure 4:
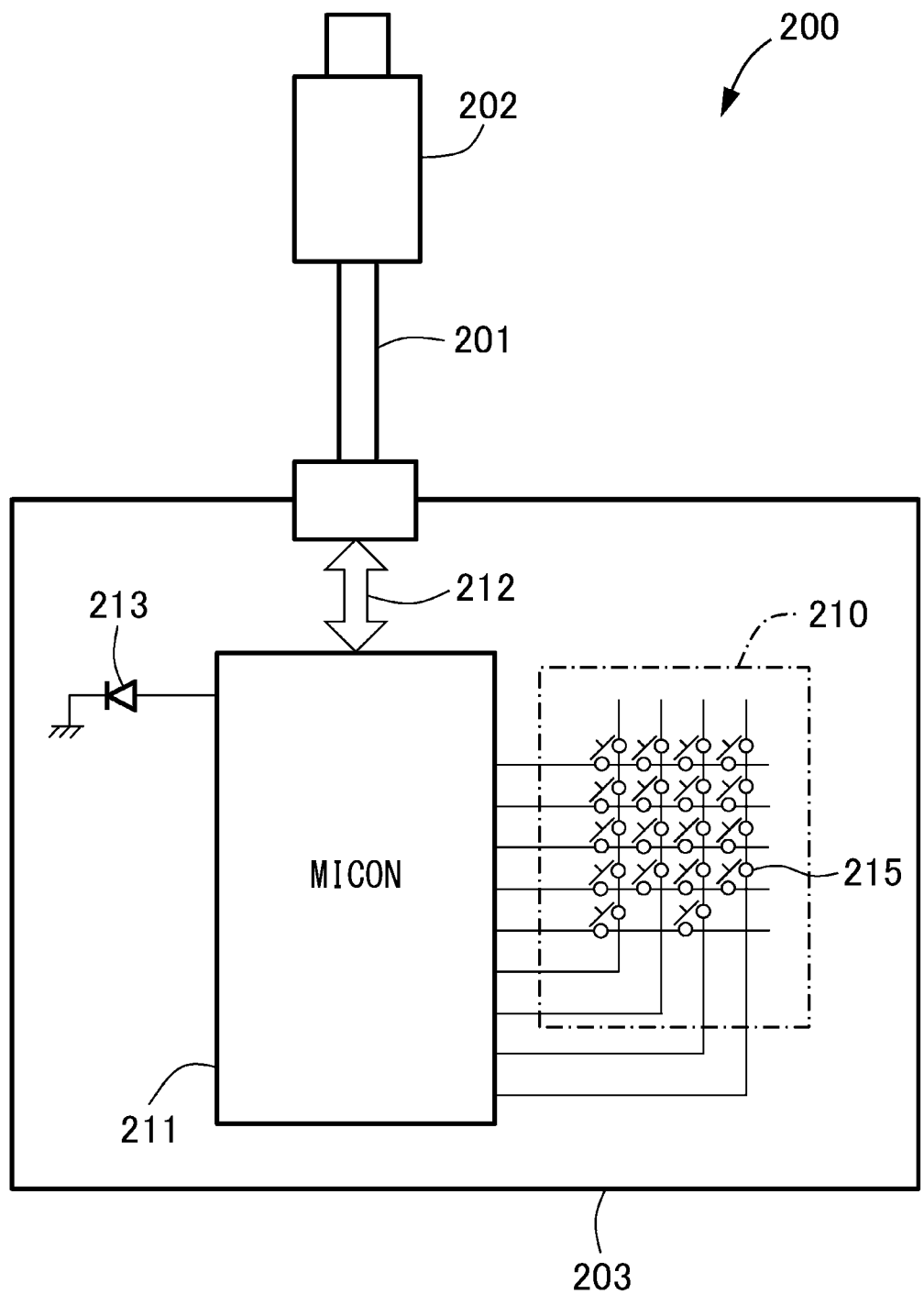
FIG. 4 is a control block diagram of the general-purpose numerical key unit of the image forming apparatus according to the first embodiment.

As shown in FIG. 4, the general-purpose numerical key unit 200 includes a hardware key unit 210, a micon 211, an inner bus 212, a connecting cable 201 a USB connector 202, and a NumLock LED (light emitting portion) 213. In this embodiment, for example, the inner bus 212 is a USB bus, the connecting cable 201 is a USB cable provided from the casing 203 to an outside, and the USB connector 202 is a USB terminal provided at a free terminal of the connecting cable 201.

The hardware key unit 210 includes a plurality of hardware keys. In this embodiment, in order to provide operation feeding (for example, click feeling) of an operation key 205 (see FIG. 3) to the user, as an example of the numerical keys, tactile switches 215 are supplied. The tactile switches 215 are disposed one by one at positions opposing the operation keys 205, respectively, on an inside of the casing 203. The tactile switch 215 is constituted by, for example, a protective cover, a plunger pushed by the operation key 205, a reversing spring not only creating the click feeling but also functioning as a movable contact, and a base portion including two contacts. Incidentally, as the tactile switch 215, an existing or new appropriate constitution can be applied, and thus will be omitted from detailed description.

The micon 211 is capable of executing, for example, input detection from the hardware key unit 210 and turning-on (lighting) control of the NumLock LED 213 which is a light source. Further, the micon 211 is capable of USB communication with a controller of an objective information processing device in the case where the micon 211 is connected to an information processing device, other than the image forming apparatus such as the PC, and is capable of USB communication with the CPU 31 of the image forming apparatus 1 via the external input output circuit 40 (see FIG. 2) in the case where the micon 211 is connected to the image forming apparatus 1. The USB connector 202 is connected to the external input/output circuit 40 via the USB port 12 provided on the side surface of the apparatus main assembly 10 and the USB connector 40a (see FIG. 2). By this, the micon 211 and the controller 30 are USB-connected to each other via the connecting cable 201, and are capable of communicating with each other through an HID protocol for USB.

In the case where the tactile switch 215 is pushed down by the user, the micon 211 specified to tactile switch 215 pushed down, and generates a code determined in advance. The micon 211 sends the generated key code to a controller of the information processing device, such as the CPU 31 of the image forming apparatus 1, the PC, or the like, via the inner bus 212 and the connecting cable 201.

Here, the general-purpose numerical key unit 200 operates in the following manner in the case where the general-purpose numerical key unit 200 is connected to the information processing device, other than the image forming apparatus 1, such as the PC, for example. First, in the case where the controller of the information processing device recognizes that the NumLock key 208 is pushed down, by an input signal from the micon 211, the controller of the information processing device selectively switches the input mode to the controller between a numerical input mode in which information on the numerical value is capable of being inputted by the numerical key portion 206 and a cursor movement mode in which a movement direction of a curser displayed in a display screen of the information processing device. Specifically, the controller of the information processing device sets (raises) a flag for switching the input mode to the numerical input mode in the case where the controller recognizes by the input signal from the micon 211 that the NumLock key 208 is pushed down. Further, in the case where the controller of the information processing device recognizes that the NumLock key is pushed down in a state in which the above-described flag is raised, the controller lowers the above-described flag and thus stores the image. On the basis of the thus stored image, the controller of the information processing device performs processing depending on the image for each of signals inputted from the general-purpose numerical key unit 200. For example, when the numerical key "4" of the numerical key portion 206 is pushed down, the numerical value "4" is inputted in the case where the input mode is the "numerical input mode", and input is made so as to move the cursor in a leftward direction in the case where the input mode is the "cursor movement mode". Similarly, when the numerical key "1" is pushed down, the numerical value "1" is inputted in the case where the input mode is the "numerical input mode", and input is made so as to move the cursor to a final position of a row where the curser is positioned in the case where the image is the "cursor movement mode".

Further, in the case where the controller of the information processing device recognizes that the NumLock key 208 of the general-purpose numerical key unit 200 is pushed down, the controller of the information processing device turns on the NumLock LED 213 in the case of turning-off of the Numlock LED 213, and turns off the Numlock LED 213 in the case of turning-on of the Numlock LED 213. That is, the controller of the information processing device shows by the turning-on of the NumLock LED 213 that the image is the numerical input mode, and shows by the turning-off of the NumLock LED 213 that the image is the cursor movement mode. Thus, in the case where the general-purpose numerical key unit 200 is connected to the connecting portion of the information processing device, such as the processing condition, other than the image forming apparatus 1, by an operation of the NumLock key 208, not only a turning-on (lighting) state of the NumLock LED 213 is switched, but also the image by the numerical key portion 206 is switched.

<Dedicated Numerical Key Unit>

Next, a hardware constitution and an operation of the dedicated numerical key unit 70 which is the input device connected to the image forming apparatus 1 will be described. This dedicated numerical key unit 70 not only includes a plurality of operation keys 100 but also is mounted on the image forming apparatus 1 including the operating portion 50 to which the information is capable of being inputted, and is capable is inputting information to the controller 30 of the image forming apparatus 1, separately from the operating portion 50. As an example of different uses for different purposes in information input between the operating portion 50 and the dedicated numerical key unit 70, setting of a density, a size, and the like relating to image formation is inputted from the operating portion 50, and numerical values such as the number of sheets subjected to the image formation and a designation number of a facsimile and the like are inputted from the dedicated numerical key unit 70.

Figure 5:
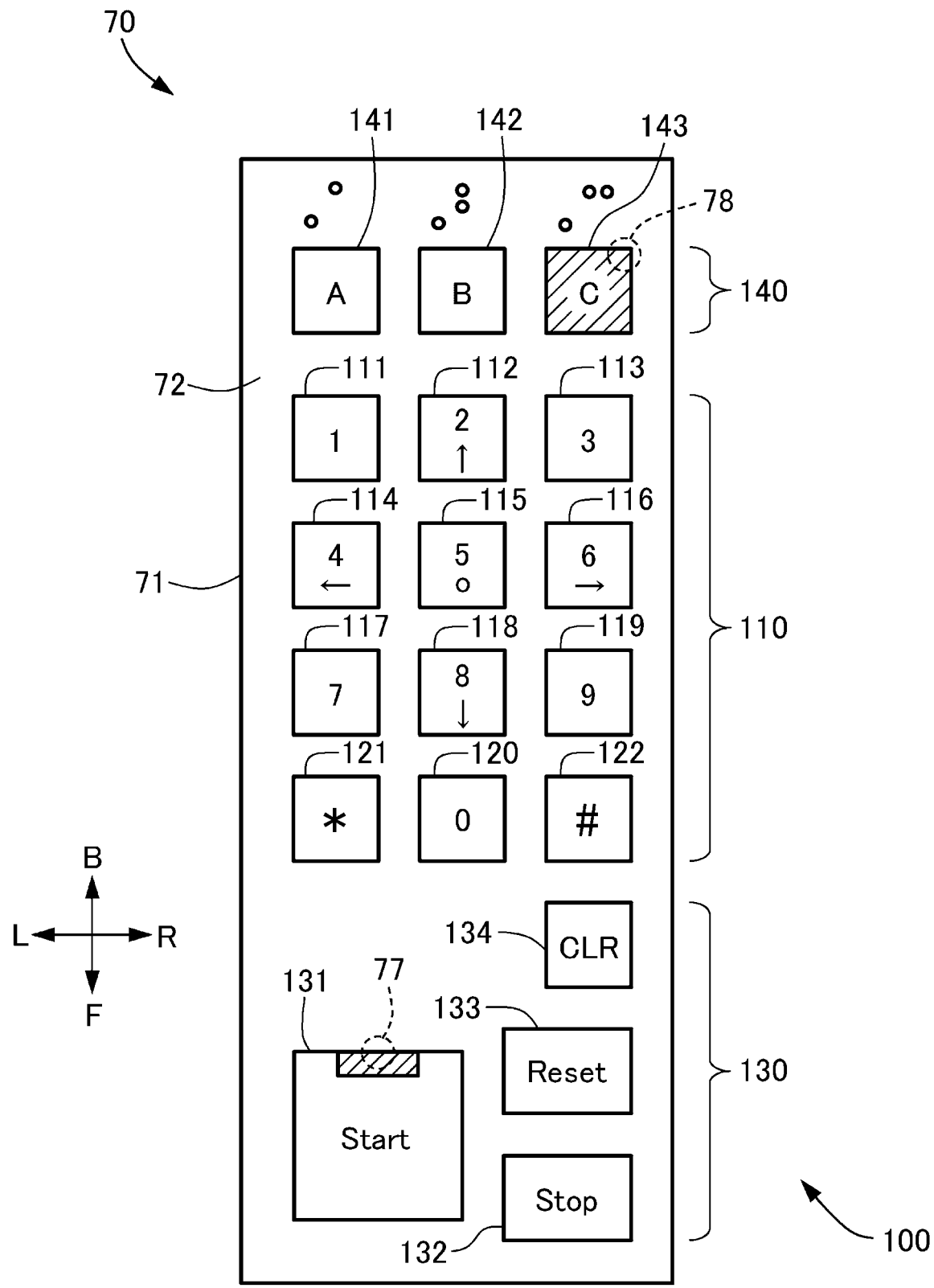
FIG. 5 is a plan view of a dedicated numerical key unit of the image forming apparatus according to the first embodiment.
Figure 6:
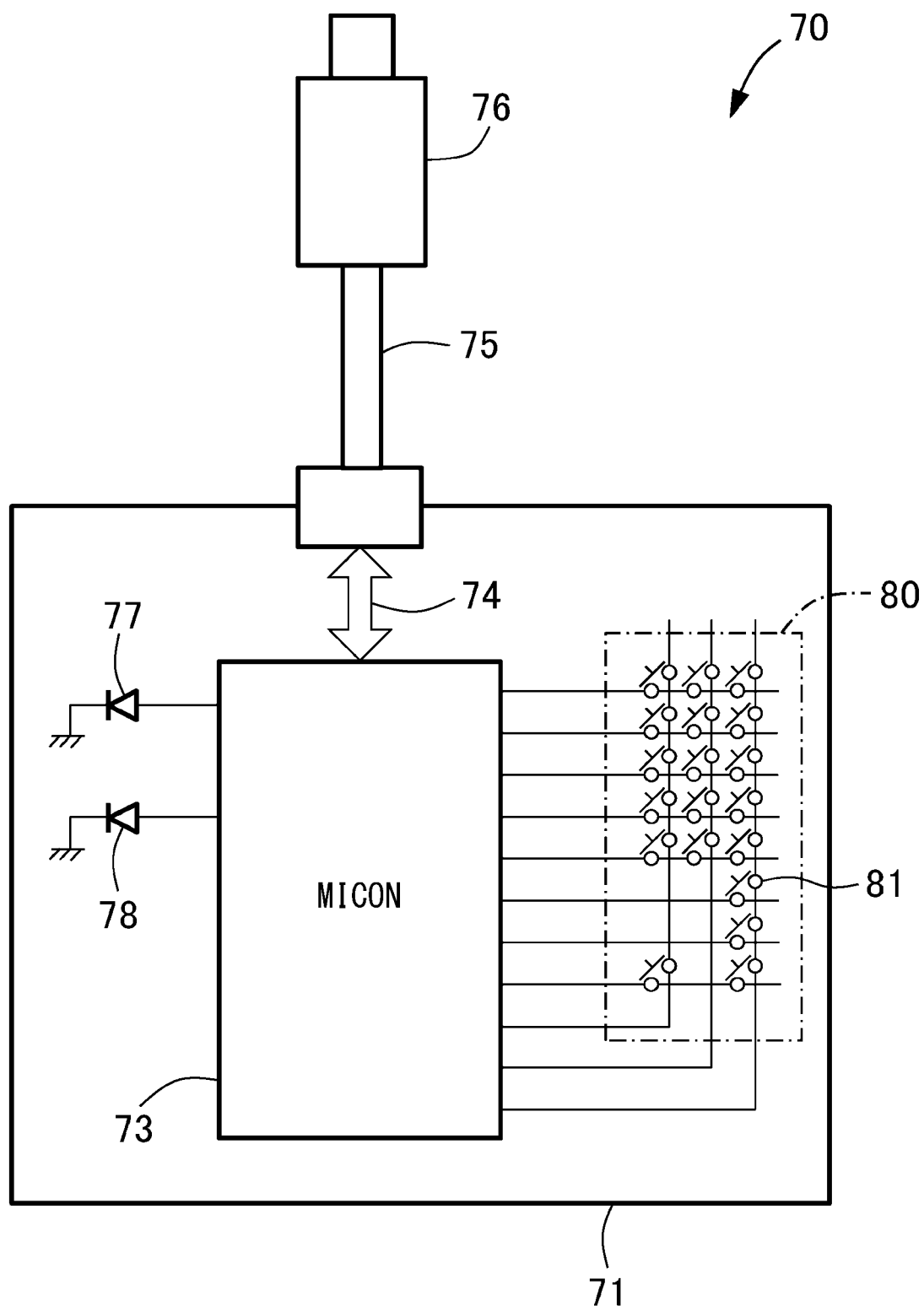
FIG. 6 is a control block diagram of the dedicated numerical key unit of the image forming apparatus according to the first embodiment.

As shown in FIG. 5, the dedicated numerical key unit 70 includes a casing 71, an upper cover 72 provided on an upper surface of the casing 71, and the operation keys 100 provided on the upper cover 72. As shown in FIG. 6, the dedicated numerical key unit 70 includes a hardware key unit 80, a micon 73, an inner bus 74, a connecting cable 75, a USB connector 76 provided at a free end of the connecting cable 75, and LEDs 77 and 78. In this embodiment, for example, the inner bus 74 is a USB bus, the connecting cable 75 is a USB cable provided from the casing 71 to an outside, and the USB connector 76 is a USB terminal. By this, the image forming apparatus 1 and the dedicated numerical key unit 70 are electrically connected to each other the connecting cable 75. Incidentally, in this embodiment, the connecting cable 75 has a constitution in which the connecting cable 75 is connected to a connector fixed to a substrate and cannot be dismounted from the dedicated numerical key unit 70. However, a mounting structure of the connecting cable 75 to the dedicated numerical key unit 70 is not limited thereto, and for example, the dedicated numerical key unit 70 is provided with a USB port connected to the inner bus 74, and the USB cable may also be connected to this USB port so as to be mounted in and dismountable from the USB port. Or, the USB cable is provided from the image forming apparatus 1 side, and a terminal of this USB cable may also be connected to the USB port connected to the inner bus 74 of the dedicated numerical key unit 70 so as to be mountable in and dismountable from the USB port.

The hardware key unit 80 includes a plurality of hardware keys. In this embodiment, as an example of the hardware keys, tactile switches 81 are applied. The micon 73 is capable of executing, for example, detection of input from the hardware key unit 80, lighting control of the plurality of LEDs 77 and 78, and USB communication between the micon 73 and the CPU 31 of the image forming apparatus 1 via the external input/output circuit 40 (see FIG. 2). The USB connector 76 is connected to the external input/output circuit 40 via the USB port 12 provided on the side surface of the apparatus main assembly 10 and the USB connector 40*a* (see FIG. 2). By this, the micon 73 and the controller 30 are USB-connected to each other via the connecting cable 75, and thus are capable of communicating with each other through an HID protocol for USB.

The micon 73 specified the tactile switch 81 pushed down and generates a code determined in advance in the case where the tactile switch 81 is pushed down by the user. The micon 73 sends the generated key code to the CPU 31 of the image forming apparatus 1 via the inner bus 74 and the connecting cable 75. The CPU 31 performs processing depending on the key inputted.

Next, an arrangement of the operation keys 100 of the numeric key unit 70 will be described using FIG. 3. The operation keys 100 roughly includes, as hardware keys, a numerical key portion (numerical value key portion) 110, an operation key portion 130, and a setting key portion 140. Here, FIG. 3 illustrates the dedicated numerical key unit 70 as viewed from the front side and is a diagram of the numerical key unit 70 viewed from a direction parallel to a pushing (pressing)-down direction of each of the hardware keys. Incidentally, the front side view is a position where the numerical values and characters provided on the hardware keys of the dedicated numerical key unit 70 are properly seen in the up-down direction.

The numerical key portion 110 includes a plurality of hardware keys capable of inputting information on at least numerical values by being pushed down. In this embodiment, the numerical key portion 110 includes numerical (value) keys 111 to 120 for inputting numerical values of 0 to 9, a key 121 for inputting "*", and a key 122 for inputting "#". By an operation of the numerical keys 111 to 120, input of the number of copied sheets and a telephone number of a facsimile, or the like can be carried out.

Here, the dedicated numerical key unit 70 in this embodiment is a dedicated numerical key unit designed, for the image forming apparatus 1, as one of options of the image forming apparatus 1. Uses of this dedicated numerical key unit 70 are principally, for example, input of a designation number (FAX number) when data is transmitted by facsimile via a telephone line. The dedicated numerical key unit 70 is designed for principal purpose of inputting the designation number of the data transmission, and therefore, an arrangement of the numerical key portion 110 is similar to an arrangement of a telephone. That is, the arrangement of the numerical key portion 110 of the dedicated numerical key unit 70 is similar to a standard arrangement shown in Recommendation E.161 of ITU-T (International Telecommunication Union-Telecommunication Standardization Sector). That is, as shown in FIG. 5, in the numerical key portion 110, the numerical keys 111 to 119 from 1 to 9 are adjacently disposed so that a rearmost side B includes 1 to 3, the front side F thereof includes 4 to 6 and a further front side F thereof includes 7 to 9. Further, on the front side F of the numerical key 118 of 8, the numerical key 120 of 0 is disposed, and the "*" key 121 and the "#" 122 are disposed on left and right sides thereof (of the "0" key). In other words, with respect to the 10 hardware keys from 0 to 9, a row of the numerical keys of 1, 2 and 3 is disposed on the rearmost side, and a row of the numerical keys of 4, 5 and 6 is disposed on a side in front of the row of 1, 2 and 3. Further, a row of the numerical keys of 7, 8 and 9 is disposed on a side in front of the row of the numerical keys 4, 5 and 6. Further, the hardware key of 0 is disposed on a side in front of the row of the hardware keys of 7, 8 and 9. Further, when these numerical keys from 0 to 9 are viewed in column, from a left(-hand) side, these numerical keys are arranged in the order of a column of the numerical keys 1, 4 and 7, a column of the hardware keys 2, 5, 8 and 0, and a column of the numerical keys 3, 6 and 9. That is, the dedicated numerical keys of 1 to 9 are aligned and arranged in a matrix of 3×3 in the case where the numerical key unit 70 is viewed from the front side, so that from an upper stage in a column direction, the numerical keys of 1 to 3, the numerical keys of 4 to 6, and the numerical keys of 7 to 9 are sequentially disposed and so that the numerical key of 0 is disposed on a further lower stage than the row of the numerical keys of 7 to 9. Incidentally, the numerical key of 0 may also be disposed in the column of the numerical keys of 1, 4 and 7 or in the column of the hardware keys of 3, 6 and 9, and the arrangement of the "*" key and the "#" key may appropriately be changed. Further, in this dedicated numerical key unit 70, electronic calculator input is not a principal purpose, and therefore, four arithmetic operators such as +, −, and the like are not provided. Thus, this dedicated numerical key unit 70 is not designed for the purpose of being connected to a PC, and therefore, is different in key arrangement from a general-purpose numerical key unit connectable to unspecified PCs and so on.

The operation key portion 130 includes a start key 131, a stop key 132, a reset key 133, and a clear key 134, and either of these keys are disposed on the front side F of the numerical key portion 110 and are capable of inputting information on predetermined processing. Here, the start key 131 is a hardware key capable of inputting information for providing a start of execution of the predetermined processing such as copying processing of the image forming apparatus 1, transmission processing of the facsimile, image reading processing of the image reading portion 20, and the like. Further, the stop key 132 is a hardware key capable of inputting an instruction to stop the predetermined processing started in response to pushing-down of the start key 131. Further, the reset key 133 is a hardware key capable of inputting information for resetting setting inputted to the image forming apparatus 1, and the clear key 134 is a hardware key capable of inputting information for clearing numerical data inputted via the numerical key portion 110.

The setting key portion 140 includes, in this embodiment, three keys consisting of a first setting key 141, a second setting key 142, and a third setting key 143, and each of these keys is comprised of a numerical key capable of inputting information for setting a predetermined mode of the image forming apparatus 1. Each of the respective setting keys 141 to 143 is disposed on the back side (rear side) B in the state in which the casing 71 is mounted on the image forming apparatus 1. Each of the setting keys 141 to 143 is a key for setting a mode and a function which are determined in advance for the image forming apparatus 1, and is a capable of inputting information on the predetermined processing.

In this embodiment, the third setting key 143 is a made switching key for switching the numerical input mode and a voice guide mode. This third setting key 143 is comprised of a plastic member having a (light) transmission property, and the LED 78 is provided inside the third setting key 143. The controller 30 turns on the LED 78 in the voice guide mode and turns off the LED 78 in the numerical input mode. For this reason, the turning-on state of the LED 78 is capable of being recognized by the user by transmission of the light through the third setting key 143. By this, the user is capable of confirming whether or not the image forming apparatus 1 is in the voice input mode or the numerical input mode, by looking at the dedicated numerical key unit 70 without looking at the operating portion 50, so that the operating property can be improved. Incidentally, to the numerical keys 112, 114, 115, 116 and 118, functions of movement designation keys for moving a selection object in a voice image are assigned, and therefore, on an upper surface of the hardware keys, in addition to the numerical values, direction displays are also put down.

<Designation Processing in Case that Numerical Key Unit is Connected>

As described above, in the case where the dedicated numerical key unit 70 designed to an option of the image forming apparatus 1 is connected, the controller 30 of the image forming apparatus 1 can properly control the numerical input mode, the voice input mode, or the like as the input mode determined in advance. However, in the case where the general-purpose numerical key unit 200 which is not manufactured as a dedicated item for the image forming apparatus is connected, the controller 30 of the image forming apparatus 1 is capable of executing the numerical input mode in order to prevent malfunction. In this case, when turning-on and turning-off of the NumLock LED 213 are switched in response to pushing-down of the NumLock key 208 similarly as the controller of the above-described PC or the like, there is a liability that the user who operates the key erroneously recognizes that the input mode is switched from the numerical input mode to the cursor movement mode. By this, there was a liability that the user performs an unnecessary operation such that the user pushes down the NumLock key 208 again in order to switch the input mode to the numerical input mode. For that reason, in this embodiment, in the case where the general-purpose numerical key unit 200 is connected to the image forming apparatus 1, the controller 30 carries out control so that the NumLock key LED 213 is always turned on. In the following, in the case where a main power source (switch) of the image forming apparatus 1 is in an ON state, an operation when the general-purpose numerical key unit 200 or the dedicated numerical key unit 70 is connected to the image forming apparatus 1 is described.

The controller 30 of the image forming apparatus 1 discriminates whether or not the USB device is connected to the USB port 12 (step S1). In the case where the controller 30 discriminated that the USB device is not connected to the USB port 12 (NO of step S1), the controller 30 ends connected numerical key discrimination processing. In the case where the controller 30 discriminated that the USB device is connected to the USB port 12 (YES of step S1), the controller 30 communicates with the USB device via the external input/output circuit 40 and acquires a device attribute of the USB device (step S2). Here, the controller 30 acquires, the device attribute of the USB device, for example, device class information, vendor ID (VID) information, product ID (PID) information, and the like.

The controller 30 discriminates whether or not the acquired device class information is a "Keyboard" (step S3). In the case where the controller 30 discriminated that the acquired device class information is not the "Keyboard" (NO of step S3), the controller 30 discriminates that the device connected to the USB port 12 is not the keyboard. In this case, the controller 30 performs processing depending on the connected device (step S4). For example, in the case where the connected device is a memory device, the controller 30 carries out control for mounting the memory device, as a memory, in a system thereof, and ends the connected numerical key discrimination processing.

In the case where the controller 30 discriminated that the acquired device class information is the "Keyboard" (YES of step S3), the controller 30 discriminates whether or not the device connected to the USB port 12 is the dedicated numerical key unit 70 (step S5). The controller 30 discriminates whether or not the device attribute such as the VID or the PID of the USB device coincides with a control value determined in advance, whereby the controller 30 discriminates whether or not the connected USB device is the dedicated numerical key unit 70.

In the case where the controller 30 discriminated that the connected USB device is not the dedicated numerical key unit 70 (NO of step S5), the controller 30 discriminates that the connected USB device is the general-purpose numerical key unit 200. Then, the controller 30 outputs an instruction to turn on the NumLock LED 213 (see FIG. 3), to the connected general-purpose numerical key unit 200 (step S6). The controller 30 starts execution of a sub-routine for operating the connected general-purpose numerical key unit 200 (step S7), and ends the connected numerical key discrimination processing. Thus, in this embodiment, the NumLock LED 213 is turned on in response to connection of the general-purpose numerical key unit 200.

On the other hand, in the case where the controller 30 discriminated that the connected USB device is the dedicated numerical key unit 70 (YES of step S5), the controller 30 starts the execution of the sub-routine for operating the connected dedicated numerical key unit 70 (step S8). Incidentally, the dedicated numerical key unit 70 does not include an LED for displaying the NumLock key or a NumLock key state. For this reason, the controller 30 does not carry out control for turning on the Numlock LED 213 as in the step S6 in the case where the general-purpose numerical key unit 200 is connected. Thereafter, the controller 30 ends the connected numerical key discrimination processing.

<General-Purpose Numerical Key Unit Operation>

Next a processing procedure of a sub-routine of a general-purpose numerical key unit operation in a flowchart shown in FIG. 7 in the case where the discrimination that the general-purpose numerical key unit 200 is connected to the image forming apparatus 1 was made will be described along a flowchart shown in FIG. 8.

The controller discriminates whether or not the connection of the general-purpose numerical key unit 200 to the USB port 12 is released (eliminated), i.e., is dismounted (step S11). The discrimination in this embodiment is made by that the CPU 31 discriminates the presence or absence of an input signal from the external input/output circuit 40. In the case where the controller 30 discriminated that the connection of the general-purpose numerical key unit 200 to the USB port 12 is released (YES of step S11), the controller 30 ends the processing of this sub-routine.

In the case where the controller 30 discriminated that the connection to the USB port 12 is not released (NO of step S11), the controller 30 discriminates whether or not a key code is detected from the general-purpose numerical key unit 200, i.e., whether or not some key is pushed down (step S12). In the case where the controller discriminated that the key code is not detected (NO of step S12), the controller 30 discriminates again whether or not the connection of the general-purpose numerical key unit 200 to the USB port 12 is released (step S11).

In the case where the controller 30 discriminated that the key code is detected (YES of step S12), the controller 30 causes the memory such as the RAM 31 to accumulate the key code sent from the general-purpose numerical key unit 200 (step S13). Then, the controller 30 discriminates whether or not the NumLock key 208 (see FIG. 3) of the general-purpose numerical key unit 200 is pushed down (step S14). On the basis of the key code accumulated in the step S13, the controller 30 detects whether or not the key code of the NumLock key 208 is sent from the connected general-purpose numerical key unit 200, whereby the controller 30 discriminates whether or not the NumLock key 208 is pushed down.

In the case where the controller 30 discriminated that the NumLock key 208 is pushed down (YES of step S14), the controller forcedly turns on the NumLock LED 213 (step S15). That is, even when the Numlock key 208 is operated, the controller 30 not only maintains the input mode at the numerical input mode but also maintains the NumLock LED 213 in the turning-on state. At this time, the controller 30 sends a turning-on command of the NumLock LED 213 to the general-purpose numerical key unit 200 via the external input/output circuit 40. By this, as regards t general-purpose numerical key unit 200, the controller 30 carries out control of turning on the NumLock LED 213 irrespective of that the Numlock LED 213 is turned on at that time. Incidentally, in this embodiment, in the step S6 of the flowchart shown in FIG. 7, the NumLock LED 213 has already been turned on. For this reason, the controller 30 may also execute processing of disregarding the pushing-down of the NumLock key 208 without sending the turning-on command of the NumLock LED 213 in the step S15.

After the controller 30 outputs, to the micon 211, a signal for forcedly turning on the NumLock LED 213, the controller 30 carries out processing to a key other than the Numlock key 208 pushed down in the general-purpose numerical key unit 200 (step S16). In the case where the general-purpose numerical key unit 200 is connected to the image forming apparatus 1, the general-purpose numerical key unit 200 operates exclusively for inputting the numerical values, so that the numerical values such as the number of sheets subjected to copying, and the like. Irrespective of occurrence or non-occurrence of the operation of the Numlock key 208, the controller 30 not only maintains the input mode at the numerical input mode but also maintains the NumLock LED 213 in the turning-on state. That is, the controller 30 set the input mode at the numerical input mode irrespective of the turning-on state of the Numlock LED 213. Accordingly, in the case where for example, the key of "4" of the numerical key portion 206 is operated, the controller 30 performs numerical value input processing for making numerical value input of "4".

Here, the controller of the information processing device such as the above-described PC or the like was described as the constitution in which the flag relating to the numerical input mode is raised by the input signal from the micon 211, but a constitution in which also in the image forming apparatus 1, the flag is raised on the basis of the input signal from the micon 211 may also be employed. In this case, even when the flag is raised, it may only be required that processing for always receiving the signal relating to the numerical key as the numerical input mode is performed. Incidentally, in the image forming apparatus 1, when a constitution in which for the signal relating to the numerical key inputted from the general-purpose numerical key unit 200, input other than the numerical value input is not received is employed, processing disregarding the input operation from the NumLock key 208 without using the flag may also be executed. That is, the controller 30 is an example of a receiving portion, a processing portion, and a setting portion.

Further, in the case where the controller 30 discriminated that the NumLock key 208 is not pushed down (NO of step S14), processing for the key other than the Numlock key 208 pushed down on the general-purpose numerical key unit 200 is performed (step S16). That is, in the numerical key portion 206, input processing of a numerical value corresponding to the key operated is performed. Thereafter, the controller 30 discriminates again whether or not the connection of the general-purpose numerical key unit 200 to the USB port 12 is released (step S11).

Incidentally, the general-purpose numerical key unit 200 includes the NumLock key 208 and the NumLock LED 213 as shown in FIG. 3, and therefore, is capable of executing processing for forcedly turning on the NumLock LED 213 in operation processing in the general-purpose numerical key unit 200. On the other hand, the dedicated numerical key unit 70 does not include the Numlock key and the NumLock LED as shown in FIG. 5, and therefore, there is no processing for forcedly turning on the NumLock LED in operation processing in the dedicated numerical key unit 70.

As described above, according to the image forming apparatus 1 of this embodiment, in the case where the general-purpose numerical key unit 200 is connected to the USB port 12, the controller 30 maintains the NumLock LED 213 in the turning-on state irrespective of the occurrence or non-occurrence of the operation of the NumLock key 208. Further, in this case, the controller 30 maintains the input mode at the numerical input mode. By this, in the case where the general-purpose numerical key unit 200 is connected to the image forming apparatus 1, switching of a light emitting state occurs so that the NumLock LED 213 is turned on or off by the operation of the NumLock key 208, so that an occurrence of situation such that the user gets uneasy about that the user can input the numerical value can be prevented. Therefore, according to the image forming apparatus 1 of this embodiment, even in the case where the general-purpose numerical key unit 200 including the NumLock LED 213 displaying the input mode is connected, a lowering in convenience of the user can be suppressed. That is, even when the user erroneously pushes down the Numlock key 208, the controller 30 continuously turns on the NumLock LED 213, so that the user is capable of obtaining an excellent operating property of capable of easily understand that the general-purpose numerical key unit 200 is in the numerical input mode.

Incidentally, in the above-described image forming apparatus 1, the case where the NumLock LED 213 is applied as a light emitting portion capable of displaying information on the input mode of the NumLock key 208 was described, but the present invention is not limited to this. For example, by a liquid crystal panel provided on the general-purpose numerical key unit 200, information on the input mode may also be made displayable.

Second Embodiment

Figure 9:
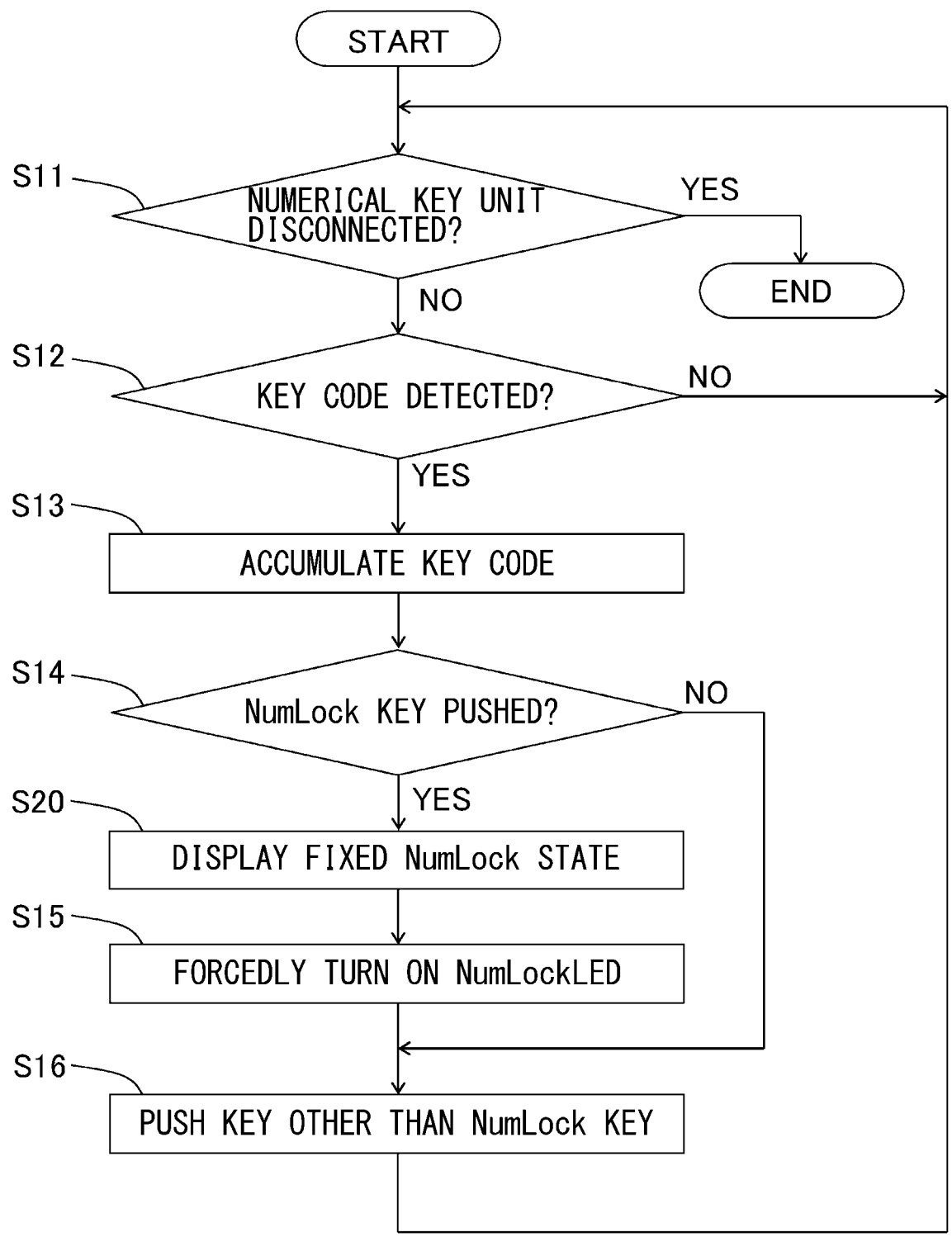
FIG. 9 is a flowchart showing a procedure of an operation in the case where the general-purpose numerical key unit is connected to an image forming apparatus according to a second embodiment.

Next a second embodiment of the present invention will be specifically described along a flowchart shown in FIG. 9. In this embodiment, a constitution is different from the constitution of the first embodiment in that when the NumLock key 208 is pushed down, a state thereof is fixed in a NumLock state and is displayed on the liquid crystal module 54 of the operating portion 50. However, other constitutions are similar to those of the first embodiment, and reference numerals or symbols thereof are made the same and will be omitted from detailed description.

Figure 7:
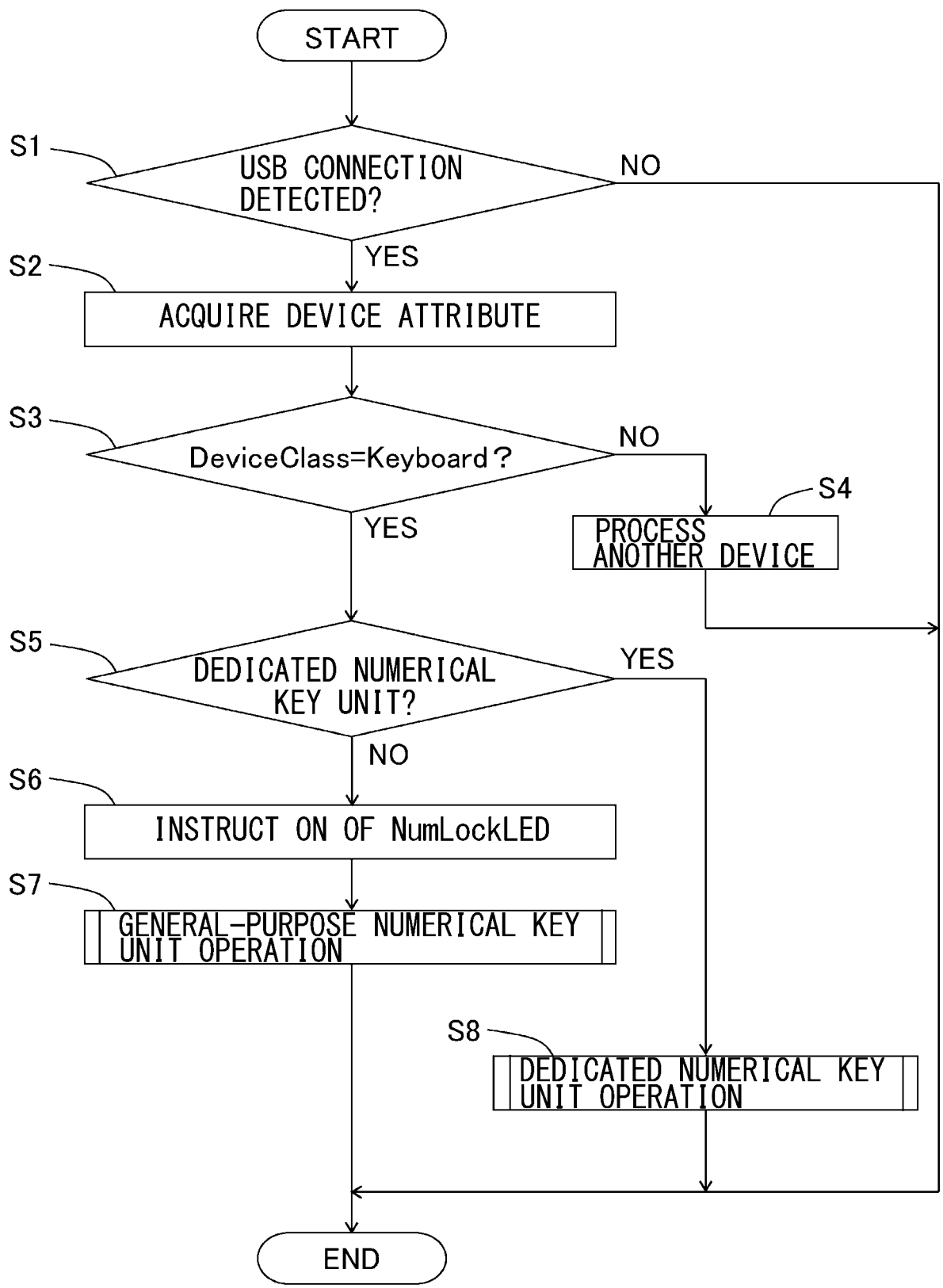
FIG. 7 is a flowchart showing a procedure of discrimination processing in the case where a numerical key unit is connected to the image forming apparatus according to the first embodiment.
Figure 8:
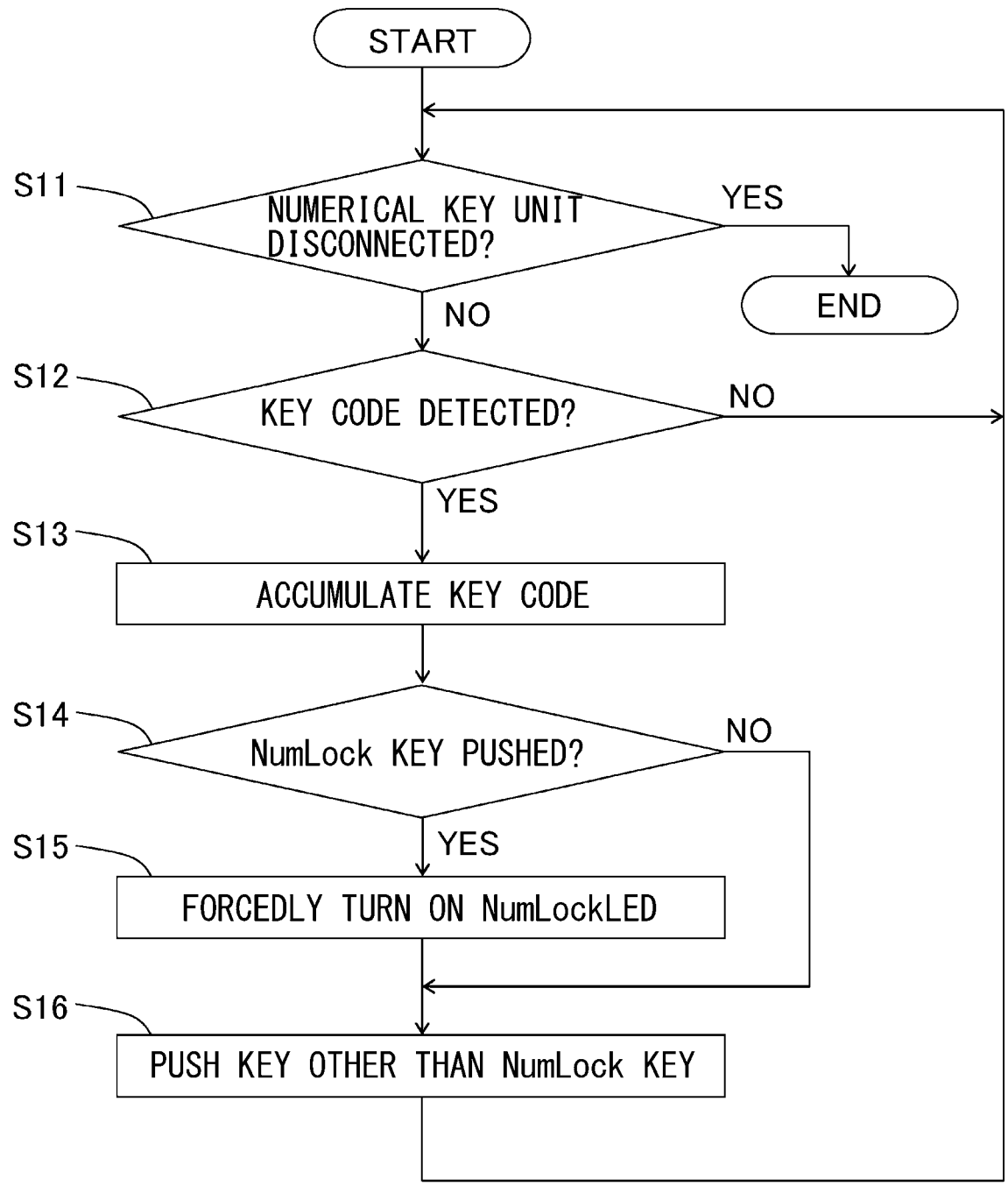
FIG. 8 is a flowchart showing a procedure of an operation in the case where the general-purpose numerical key unit is connected to the image forming apparatus according to the first embodiment.

Also, in this embodiment, the procedure of the connected numerical key discrimination processing in the case where the general-purpose numerical key unit 200 or the dedicated numerical key unit 70 is connected to the image forming apparatus 1, the flowchart shown in FIG. 7 is applied. After an end of the connected numerical key discrimination processing, a processing procedure of a sub-routine of a general-purpose numerical key unit operation in the case where the discrimination that the general-purpose numerical key unit 200 is connected to the image forming apparatus 1 was made will be described along a flowchart shown in FIG. 9. Incidentally, in the flowchart shown in FIG. 9, processes similar to those in the flowchart shown in FIG. 8 are represented by the same reference numerals or symbols and will be omitted from detailed description.

The controller discriminates whether or not the connection of the general-purpose numerical key unit 200 to the USB port 12 is released (eliminated), i.e., is dismounted (step S11). In the case where the controller discriminated that the connection to the USB port 12 is not released (NO of step S11), the controller 30 discriminates whether or not the key code is detected from the general-purpose numerical key unit 200 (step S12). In the case where the controller 30 discriminated that the key code is detected (YES of step S12), the controller 30 causes the memory such as the RAM 31 to accumulate the key code sent from the general-purpose numerical key unit 200 (step S13). The controller discriminates whether or not the NumLock key 208 (see FIG. 3) of the general-purpose numerical key unit 200 is pushed down (step S14).

In the case where the controller 30 discriminated that the NumLock key 208 is pushed down (YES of step S14), the controller causes the operating portion 50 of the image forming apparatus 1 to display that the input mode is fixed to the NumLock state (step S20). As display contents in this embodiment, for example, a warning to the effect that the operation of the NumLock key 208 is invalid, such as a warning to the effect that the input mode is fixed to the NumLock state, or the like is displayed. Specifically, the NumLock state cannot be switched even when the NumLock key 208 is pushed down, so that the controller 30 causes the operating portion 50 to display such that "THE NumLock IS FIXED TO ON, AND SWITCHING OPERATION ON OF THE NumLock CANNOT BE PERFORMED.". Incidentally, in this embodiment, the controller causes the operating portion 50 to display that the input mode is fixed to the NumLock state, but the present invention is not limited to this, the display portion may be provided on the general-purpose numerical key unit 200 itself, or notification may also be made by voice.

Thereafter, similarly as in the first embodiment, even when the Numlock key 208 is operated, the controller 30 not only maintains the input mode at the numerical input mode but also forcedly turns on the NumLock LED 213 (step S15). After the controller 30 for forcedly turns on the NumLock LED 213, the controller 30 carries out processing to a key other than the Numlock key 208 pushed down in the general-purpose numerical key unit 200 (step S16). Thereafter, the controller 30 discriminates again whether or not the connection of the general-purpose numerical key unit 200 to the USB port 12 is released (step S11).

As described above, according to the image forming apparatus 1 of this embodiment, in the case where the general-purpose numerical key unit 200 is connected to the image forming apparatus 1, the NumLock LED 213 is switched between turning-on and turning-off by the operation of the NumLock key 208. That is, the controller 30 turns on the NumLock LED 213 in response to connection of the general-purpose numerical key unit 200, even when the NumLock key 208 is operated, the turning-on state of the NumLock LED 213 is not changed, and the input mode is the numerical input mode irrespective of the turning-on state of the NumLock LED 213. For this reason, even in the case where the general-purpose numerical key unit 200 including the NumLock LED 213 displaying the input mode is connected, a lowering in convenience of the user can be suppressed. Further, even when the user erroneously pushes down the Numlock key 208, the user is notified of that the numerical input mode is fixed and cannot be switched, so that the user is capable of obtaining an excellent operating property.

OTHER EMBODIMENTS

In each of the above-described embodiments, the case where the general-purpose numerical key unit 200 is applied as the predetermined input device was described, but the present invention is not limited to this. For example, this embodiment may also be applied to the case where for example, as the predetermined input device, a full keyboard not only including, for example, the NumLock LED 213 and the NumLock key 208 but also capable of character input is connected.

INDUSTRIAL APPLICABILITY

According to the present invention, the input device and the image forming apparatus capable of solving various problems in the case where the general-purpose input device is connected to the image forming apparatus is provided.

The present invention is not restricted to the foregoing embodiment, but can be variously changed and modified without departing from the spirit and the scope of the present invention. Accordingly, the following claims are attached hereto to make public the scope of the present invention.

This application claims the Conventional Priority from Japanese Patent Application 2019-018767 filed Feb. 5, 2019, all disclosure of which is incorporated by reference herein.

The invention claimed is:

1. An image forming apparatus to which an input device is connectable, the input device including a plurality of hardware keys which include a numerical key portion where a plurality of numerical keys capable of inputting numerical information on 0 to 9, respectively, by being pushed down by a user are provided in an arrangement of an electronic calculator type, an outputting portion for outputting a plurality of key signals corresponding to the hardware keys, a switching key capable of selectively switching, in a case that the input device is connected to an information processing device including a display screen, a condition when the information processing device processes the key signal from the outputting portion, between a first processing condition in which the key signal is processed as information on a numerical value and a second processing condition in which the key signal is processed as information for moving a cursor displayed on the display screen, and a light emitting portion capable of notifying a user of that the first processing condition is set for the information processing device by being turned on and capable of notifying the user of that the second processing condition is set for the information processing device by being turned off, the image forming apparatus comprising:

an image forming portion for forming the image on a recording medium;

an operating panel capable of displaying a software execution key, as a software key, for providing an instruction of a start of image reading to an image reading device;

a connecting portion to which the input device is connectable;

a receiving portion for receiving the key signal; and a processing portion for processing the key signal received by the receiving portion, wherein the light emitting portion is switched between in a turn-on state and in a turn-off state on the basis of an operation of the switching key, and wherein the receiving portion receives the key signal indicating numerical information irrespective of the turn-on state or the turn-off state of the light emitting portion.

2. The image forming apparatus according to claim 1, further comprising a controller for controlling the image forming apparatus, wherein the controller is configured to set a number of sheets subjected to image formation by the image forming portion on the basis of the key signal received by the receiving portion.

3. The image forming apparatus according to claim 1, further comprising:

a controller for controlling the image forming apparatus; and a communication portion configured to transmit and receive data via a telephone line, wherein the controller is configured to input a designation number of facsimile on the basis of the key signal received by the receiving portion.

4. The image forming apparatus according to claim 1, wherein the connecting portion is a connector of a USB standard.

5. The image forming apparatus according to claim 1, further comprising a discharging portion provided below the image reading device with respect to a vertical direction, for discharging the recording medium on which the image is formed by the image forming portion, wherein the operating panel is provided above the discharging portion with respect to the vertical direction.

6. The image forming apparatus according to claim 1, further comprising an apparatus main assembly including the image forming portion therein, wherein the operating panel is provided rotatably relative to the apparatus main assembly.

* * * * *